United States Patent
Lee

(10) Patent No.: US 7,855,721 B2
(45) Date of Patent: Dec. 21, 2010

(54) POWER SAVING CONTROL METHOD AND APPARATUS EMPLOYING THE SAME

(75) Inventor: Jae-sung Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 879 days.

(21) Appl. No.: 11/517,432

(22) Filed: Sep. 8, 2006

(65) Prior Publication Data
US 2007/0057937 A1 Mar. 15, 2007

(30) Foreign Application Priority Data
Sep. 12, 2005 (KR) .............. 10-2005-0084769

(51) Int. Cl.
*G09G 5/00* (2006.01)
*G03G 15/20* (2006.01)

(52) U.S. Cl. ......................... 345/211; 399/67

(58) Field of Classification Search ............ 399/67, 399/88
See application file for complete search history.

(56) References Cited

U.S. PATENT DOCUMENTS

| | | | |
|---|---|---|---|
| 6,184,875 B1* | 2/2001 | Matsuura | 345/211 |
| 6,226,472 B1 | 5/2001 | Yun | |
| 2002/0126113 A1* | 9/2002 | Iwasaki | 345/211 |
| 2002/0141776 A1* | 10/2002 | Hirakawa et al. | 399/81 |
| 2003/0128998 A1* | 7/2003 | Nishi | 399/67 |

FOREIGN PATENT DOCUMENTS

| | | |
|---|---|---|
| EP | 1 122 712 A1 | 8/2001 |
| JP | 2002-344683 | 11/2002 |
| KR | 1998-0003967 | 3/1998 |
| KR | 1999-0019423 | 3/1999 |
| KR | 10-2005-0035429 A | 4/2005 |

* cited by examiner

*Primary Examiner*—Kevin M Nguyen
(74) *Attorney, Agent, or Firm*—Roylance, Abrams, Berdo and Goodman, L.L.P.

(57) ABSTRACT

An apparatus and method for saving power in an office machine having a display panel are provided. The method comprises setting the apparatus in an operation standby mode, detecting whether an error exists in the apparatus and turning on the display panel to display the error thereon when the error is detected. Furthermore, the apparatus keeps the display panel in an off state when the error is not detected. Thus, the exemplary embodiments of the present invention provide a power saving method of an office machine which prevents unnecessary power consumption during an operation of an office machine having a display panel.

16 Claims, 3 Drawing Sheets

POWER SAVING CONTROL METHOD AND APPARATUS EMPLOYING THE SAME

CROSS-REFERENCE TO RELATED APPLICATIONS

This application claims the benefit under 35 U.S.C. §119 (a) of Korean Patent Application No. 2005-0084769, filed on Sep. 12, 2005, in the Korean Intellectual Property Office, the disclosure of which is hereby incorporated by reference.

BACKGROUND OF THE INVENTION

1. Field of the Invention:

The present invention relates to a power-saving control method and a apparatus employing the same. More particularly, the present invention relates to an apparatus and method for saving power by driving a display panel in a power saving mode.

2. Description of the Related Art:

Generally, an office machine may comprise a photocopier, a facsimile, a printer and the like. With the recent development of display technology, many office machines employ a display panel such as a liquid crystal display (LCD) panel to enhance a user's convenience.

Furthermore, such display panels are advancing in development in line with the advance of office machines.

However, office machines which employ a display panel such as the advanced LCD panel consume a large amount of power.

Also, the conventional office machines consume power unnecessarily as the display panel displays information even when the office machines operate normally.

Accordingly, there is a need for an improved apparatus and method for saving power in an office machine.

SUMMARY OF THE INVENTION

Exemplary embodiments of the present invention address at least the above problems and/or disadvantages and provide at least the advantages described below. Accordingly, it is an aspect of exemplary embodiments of the present invention to provide a appartus and method for saving power which prevents unnecessary power consumption during an operation of an office machine having a display panel.

Additional aspects and/or advantages of exemplary embodiments of the present invention will be set forth in part in the description which follows and, in part, will be obvious from the description, or may be learned by practice.

The foregoing and/or other aspects of exemplary embodiments of the present invention are also achieved by providing an apparatus and method for saving power used by an office machine having a display panel, comprising setting the office machine in standby mode, detecting whether an error exists in the office machine, turning on the display panel to display the error thereon when the error is detected, and keeping the display panel in an off state when the error is not detected.

According to another aspect of exemplary embodiments of the present invention, there is further provided a display lamp to display a normal operation state of the office machine, wherein the display lamp is illuminated when the error is not detected.

According to another aspect of exemplary embodiments of the present invention, there is provided an apparatus and method for converting an office machine into a power saving mode when the office machine receives a request to be converted into the power saving mode, converting into an operation standby mode when the office machine receives a request to be converted into the operation standby mode, detecting whether an error exists in the office machine, turning on the display panel to display the error when the error is detected, and keeping the display panel in the off state when the error is not detected.

According to another aspect of exemplary embodiments of the present invention, the apparatus and method further comprise turning on the display panel according to a command input by a user.

BRIEF DESCRIPTION OF THE DRAWINGS

The above and/or other aspects and advantages of certain exemplary embodiments of the present invention will become apparent and more readily appreciated from the following description taken in conjunction with the accompanying drawings of which.

Throughout the drawings, the same drawing reference numerals will be understood to refer to the same elements, features, and structures.

DETAILED DESCRIPTION OF EXEMPLARY EMBODIMENTS

The matters defined in the description such as a detailed construction and elements are provided to assist in a comprehensive understanding of the embodiments of the invention and are merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness. Reference will now be made in detail to exemplary embodiments of the present invention, examples of which are illustrated in the accompanying drawings.

Figure 1:
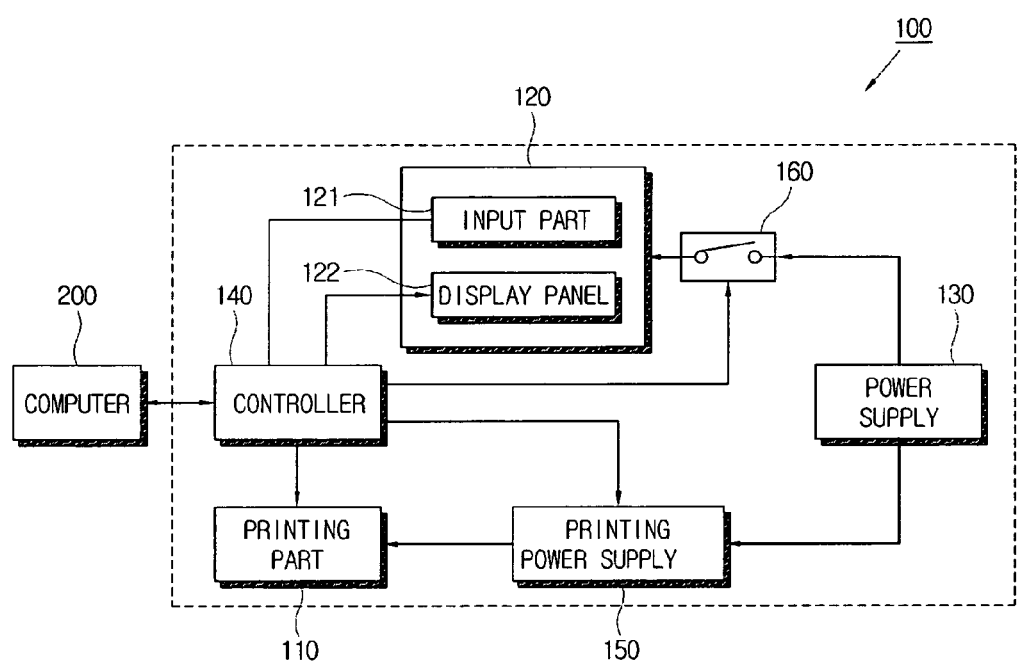
FIG. 1 is a block diagram of an office machine according to an exemplary embodiment of the present invention.

FIG. 1 is a block diagram of an image forming apparatus 100 according to an exemplary embodiment of the present invention. The exemplary image forming apparatus 100 may include a printer, a facsimile, a multifunction device or similar apparatus that forms an image on a printing media. However, the present invention is not limited to an apparatus that forms an image on a printing media.

The exemplary image forming apparatus 100 comprises a printing part 110 which performs a printing operation, a user interface 120 which displays an operation state of the image forming apparatus 100 and receives a command input from a user, a power supply 130 which supplies power to the printing part 110 and the user interface 120 and a controller 140 which controls the printing part 110 and the user interface 120.

The controller 140 controls power supplied to the printing part 110 through a printing power supply 150 which is provided between the printing part 110 and the power supply 130, and controls power supplied to the user interface 120 through a switch 160 which is provided between the user interface 120 and the power supply 130.

Furthermore, the controller 140 may be connected with an external computer 200 through a network.

The user interface 120 may comprise an input part 121 to which a user inputs a command and a display panel 122 which displays an operation state of the image forming apparatus 100. The user interface 120 may perform input and output functions with the display panel 122 by employing a touch screen and the like.

Printing data, which may be received from the computer 200, is converted into a printing command by the controller 140. The printing part 110 receives the printing command and performs the printing operation on a printing medium. Here, the controller 140 controls the display panel 122 of the user interface 120 to display a current operation state, in other words a printing operation state of the image forming apparatus 100.

Meanwhile, a method of saving power of the office machine according to the exemplary embodiment of the present invention is accomplished by on/off operations of the display panel 122 through on/off controls of the switch 160 by the controller 140. Details of the power saving method of the office machine will be described later.

Figure 2:
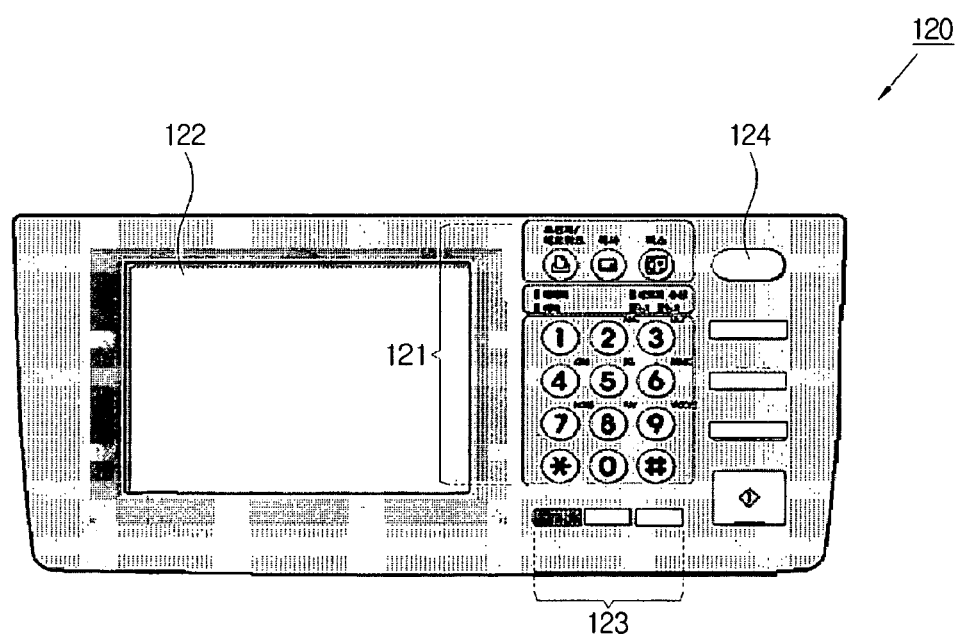
FIG. 2 is a plan view of an element of the exemplary office machine shown in FIG. 1.

FIG. 2 illustrates an external appearance of an exemplary user interface 120 of the image forming apparatus 100 shown in FIG. 1. The exemplary user interface 120 comprises the display panel 122 provided, for example, on a left side thereof as a touch screen and the input part 121 which is provided, for example, on a right side thereof and having a plurality of buttons. The user interface 120 further comprises a display lamp 123 such as one or more LEDs (light emitting diodes) to display a normal or abnormal state of the image forming apparatus 100 and a display panel power button 124 to selectively turn on and off the display panel 122 by a user. The display panel 122 may be turned on and off by an operation of the display panel power button 124 by a user, other than by control of the controller 140.

A user may input a command through the input part 121 or through the display panel 122 when a touch screen is provided as the display panel 122. Also, the display panel 122 displays the operation state of the image forming apparatus 100 through a display control of the controller 140.

Figure 3:
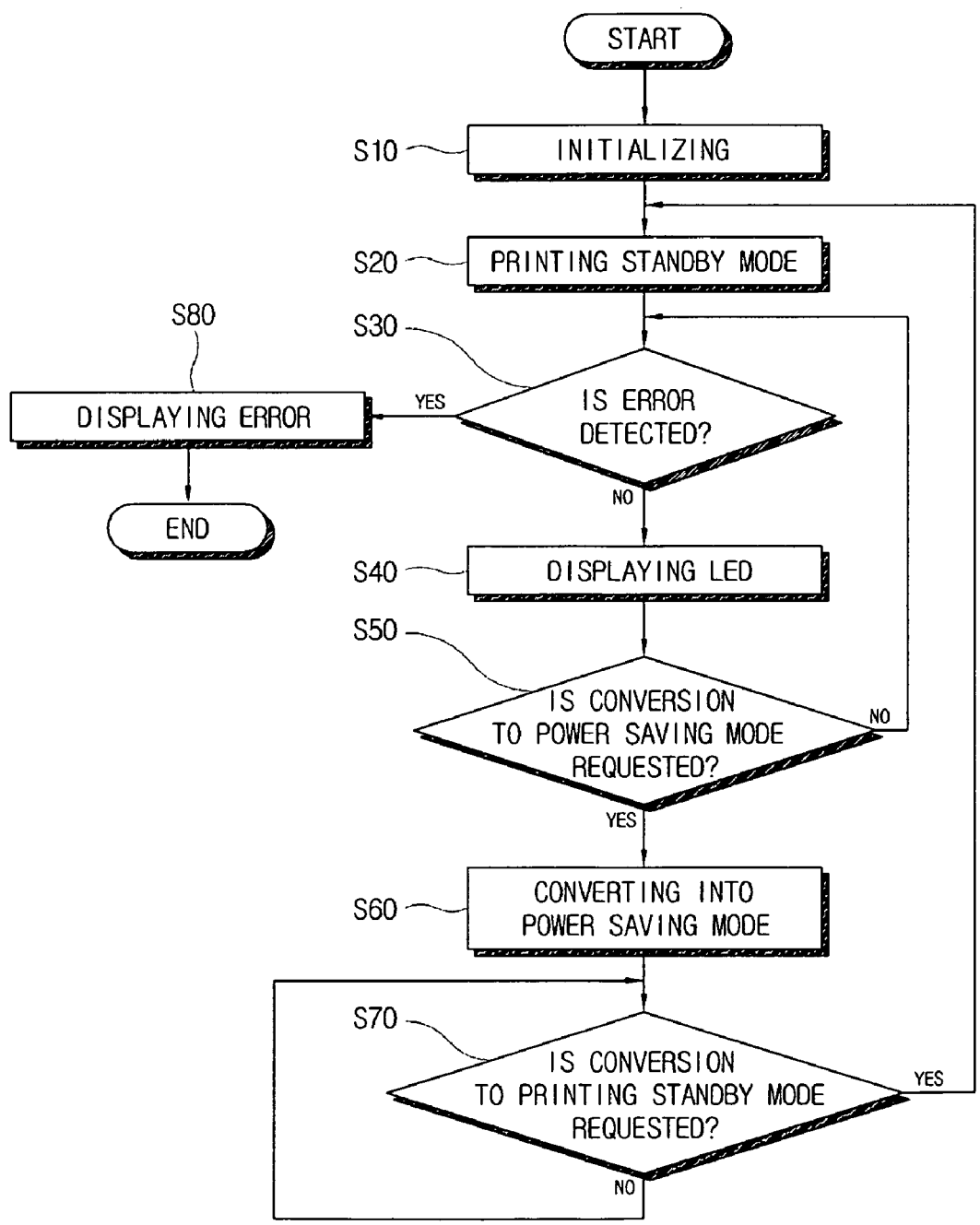
FIG. 3 is a control flowchart of a power-saving control method of an office machine according to an exemplary embodiment of the present invention.

FIG. 3 is a control flowchart illustrating an exemplary power-saving control method of the image forming apparatus 100 of FIG. 1.

First, the image forming apparatus 100 is initialized when receiving power (S10). The initialization may comprise trial operations of respective elements of the image forming apparatus 100 and removing of a latent image and toner remaining in the printing part 110. During the initialization (SI 0), the display 122 remains in an off state.

The image forming apparatus 100 is set in a printing standby mode through the initialization (S20). Here, in the printing standby mode, the image forming apparatus 100 is ready to immediately perform a printing operation. Typically, in the printing standby mode, the printing part 110 receives power so as to perform a printing operation as required.

In the printing standby mode, the controller 140 determines whether the respective elements of the image forming apparatus 100 have errors (S30). That is, the controller 140 checks for jams, printing paper, remaining toner, malfunction of the elements and the like.

When the controller 140 determines that there is no error, the controller 140 turns on the display lamp 123 only while the display panel 122 of the user interface 120 is turned off, to display the normal state of the image forming apparatus 100 (S40).

Conversely, when the controller 140 determines that there is an error, the controller 140 turns on the display panel 122 to display the corresponding error information thereon (S80).

Accordingly, the display panel 122 of the user interface 120 remains in an off state when the image forming apparatus 100 is initialized and when the apparatus operates normally. When the image forming apparatus 100 operates abnormally, the display panel 122 of the user interface 120 is converted into an on state to display the error information thereon.

If error information is displayed in S80, a user may respond properly to the error information displayed on the display panel 122.

Meanwhile, after the display lamp 123 is turned on, the image forming apparatus 100 is converted into a power saving mode when a printing operation is not performed for a period of time (S50 and S60). A program may be used to determine whether the period of time has passed. When the period of time has passed without a printing operation, the controller 140 may recognize it as a request for a conversion to the power saving mode (S50).

In the power saving mode (S60), the controller 140 reduces the power supplied to the printing part 110, thereby minimizing power consumption of the image forming apparatus 100. To convert from the power saving mode to the printing standby mode again, the printing part 110 may be preheated by receiving power at a normal level.

When the controller 140 receives a printing command through data transmission from the external computer 200 or through the user interface 120 by a user, the controller 140 determines to convert the image forming apparatus 100 into the printing standby mode (S70). Then, the image forming apparatus 100 is converted into the printing standby mode by the control of the controller 140 (S20).

In the printing standby mode, the image forming apparatus 100 detects for error again before performing the printing operation (S30). If an error is detected, the image forming apparatus 100 turns on the display 122 to display the detected error on the display panel 122 (S80). When the error is not detected, the image forming apparatus 100 turns on the display lamp 123 only while turning off the display panel 122, to perform the printing operation.

Meanwhile, a user may turn on the display panel 122 through the display panel power button 124 to check the operation state of the image forming apparatus 100.

In the exemplary embodiments of the present invention, the image forming apparatus 100 is provided as an example of the office machine, but the present invention is not limited thereto. Alternatively, the present invention may be applicable to various office machines having a display panel to save power through on/off controls of the display panel.

Although a few exemplary embodiments of the present invention have been shown and described, it will be appreciated by those skilled in the art that changes may be made in these embodiments without departing from the principles and spirit of the invention, the scope of which is defined in the appended claims and their full scope of equivalents.

What is claimed is:

1. A control method for an apparatus having a display panel, the method comprising:
   setting the apparatus in a standby mode while supplying power to preheat a printing part, wherein in the standby mode the apparatus is ready to immediately perform a printing operation;
   detecting whether a first error exists in the apparatus;
   turning on the display panel and displaying the first error thereon when the first error is detected; and
   turning on the display panel by pressing a display panel power button, other than by control of a controller of the apparatus.

2. The method according to claim 1, wherein the setting the apparatus in a standby mode comprises maintaining the display panel in an off state.

3. The method according to claim 2, further comprising keeping the display panel in an off state when the first error is not detected.

4. The method according to claim 3, further comprising turning on a display lamp when the first error is not detected.

5. The method according to claim 1, further comprising:
converting into a power saving mode when the apparatus receives a request to be converted into the power saving mode;
converting into the standby mode when the apparatus receives a request to be converted into the standby mode;
detecting whether a second error exists in the apparatus; and
turning on the display panel to display the second error when the second error is detected.

6. The method according to claim 5, wherein the converting into the standby mode comprises maintaining the display panel in an off state.

7. The method according to claim 6, further comprising keeping the display panel in an off state when the second error is not detected.

8. The method according to claim 1, further comprising turning on the display panel according to a command input by a user.

9. An apparatus, comprising:
a display panel;
a controller, wherein the apparatus is set in a standby mode while supplying power to preheat a printing part and is ready to immediately perform a printing operation and evaluated for a plurality of errors such that if an error is detected, the controller turns on the display panel and displays the error; and
a display panel power button to selectively turn on/off the display panel, other than by control of the controller.

10. The apparatus of claim 9, wherein the display panel is maintained in an off state when the apparatus is set in a standby mode.

11. The apparatus of claim 10, wherein the display panel is maintained in the off state when an error is not detected.

12. The apparatus of claim 11, further comprising a display light wherein the display light is illuminated when an error is not detected.

13. The apparatus of claim 12, wherein the display light comprises a plurality of lights.

14. The apparatus of claim 12, wherein the display light is a light emitting diode.

15. The apparatus of claim 12, further comprising:
a power supply; and
a switch, wherein the controller controls the switch to provide power from the power supply to the display panel when the error is displayed and controls the switch to provide power from the power supply to the display light when the error is not detected.

16. The apparatus of claim 15, wherein the controller sets the apparatus in a power saving mode after the controller does not receive a control signal for a time period and the controller reduces power supplied to the apparatus by the power supply while in the power saving mode.

* * * * *